US009093345B2

(12) United States Patent
Kato et al.

(10) Patent No.: US 9,093,345 B2

(45) Date of Patent: Jul. 28, 2015

(54) SOLID-STATE IMAGING APPARATUS AND IMAGING SYSTEM

(71) Applicant: CANON KABUSHIKI KAISHA, Tokyo (JP)

(72) Inventors: Taro Kato, Kawasaki (JP); Hiroaki Kobayashi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 106 days.

(21) Appl. No.: 14/051,904

(22) Filed: Oct. 11, 2013

(65) Prior Publication Data

US 2014/0117481 A1 May 1, 2014

(30) Foreign Application Priority Data

Oct. 26, 2012 (JP) ................................ 2012-237267
Oct. 26, 2012 (JP) ................................ 2012-237268

(51) Int. Cl.
*H01L 31/0232* (2014.01)
*H01L 27/146* (2006.01)

(52) U.S. Cl.
CPC ...... *H01L 27/14629* (2013.01); *H01L 27/1464* (2013.01); *H01L 27/14641* (2013.01); *H01L 27/14645* (2013.01)

(58) Field of Classification Search
None
See application file for complete search history.

(56) References Cited

U.S. PATENT DOCUMENTS

| | | | | |
|---|---|---|---|---|
| 7,755,123 | B2 | 7/2010 | Dungan et al. | 257/294 |
| 8,514,309 | B2 | 8/2013 | Kato et al. | |
| 2006/0292735 | A1* | 12/2006 | Boettiger et al. | 438/70 |
| 2008/0191299 | A1* | 8/2008 | Parks | 257/432 |
| 2012/0033116 | A1 | 2/2012 | Kato | |
| 2013/0100322 | A1 | 4/2013 | Noda et al. | |
| 2014/0035086 | A1 | 2/2014 | Kato | |

FOREIGN PATENT DOCUMENTS

| | | |
|---|---|---|
| JP | 2010-050260 A | 3/2010 |
| JP | 2010-118412 A | 5/2010 |

* cited by examiner

*Primary Examiner* — Bilkis Jahan
*Assistant Examiner* — Kevin Quinto
(74) *Attorney, Agent, or Firm* — Fitzpatrick, Cella, Harper & Scinto

(57) ABSTRACT

A solid-state imaging apparatus comprising a semiconductor layer, a first region on a side of a first surface of the semiconductor layer, and a second region on a side of a second surface of the semiconductor layer, wherein photoelectric conversion portions are arrayed in the semiconductor layer, lens portions are arrayed in the first region, and an interconnection pattern and reflection portions are arrayed in the second region, in one of pixels of the apparatus, the apparatus has a structure in which sectional areas, on the second surface and on a reflection surface of the reflection portion, of the light beam traveling from the photoelectric conversion portion, are larger than a sectional area, in a portion between the photoelectric conversion portion and the reflection portion, of the light beam traveling from the photoelectric conversion portion.

20 Claims, 4 Drawing Sheets

F I G. 2A
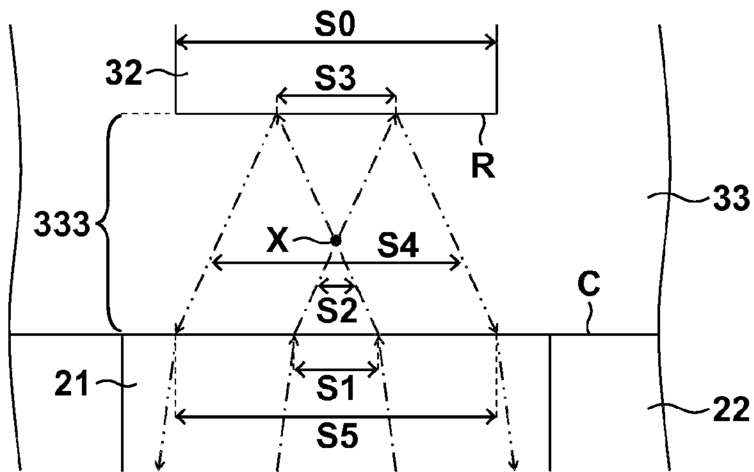
F I G. 2B
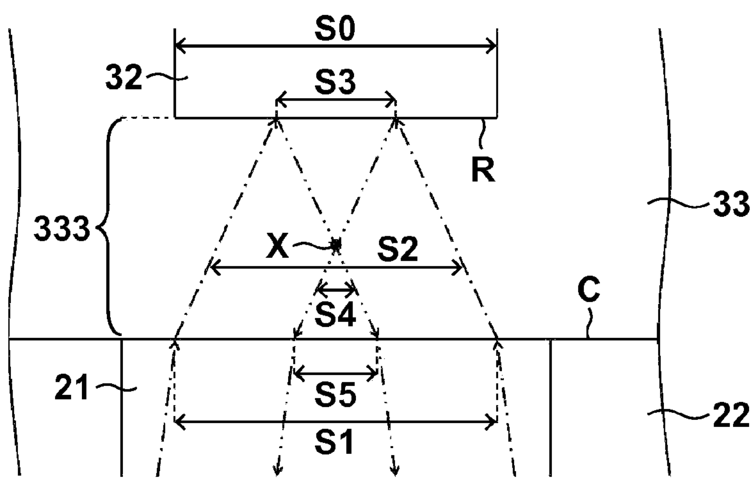
F I G. 2C
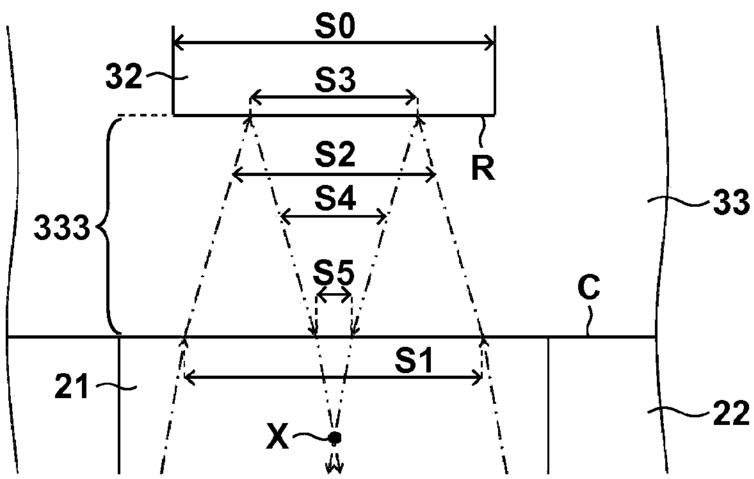

SOLID-STATE IMAGING APPARATUS AND IMAGING SYSTEM

BACKGROUND OF THE INVENTION

1. Field of the Invention

The present invention relates to a solid-state imaging apparatus and an imaging system.

2. Description of the Related Art

A back-side illumination solid-state imaging apparatus generally includes a semiconductor layer that is thinner than in a front-side illumination solid-state imaging apparatus. For this reason, incident light (especially, light having a long wavelength) may transmit through the semiconductor layer without being sufficiently absorbed. Each of Japanese Patent Laid-Open No. 2010-118412 and U.S. Pat. No. 7,755,123 discloses a structure including a reflection portion that reflects light that has transmitted through a semiconductor layer (semiconductor substrate). According to the structure of Japanese Patent Laid-Open No. 2010-118412, a microlens 110 condenses incident light in a photoelectric conversion portion 130, and a reflection portion 150 condenses reflected light in the photoelectric conversion portion 130. According to the structure of U.S. Pat. No. 7,755,123, light components L1 and L3 (vertical incident light) that have vertically entered the apparatus are condensed on a surface 126 of a reflection portion 128.

In the solid-state imaging apparatus, interconnections for power supply, pixel driving, or signal read are provided on the obverse surface side of the semiconductor layer. For this reason, instead of providing a reflection portion having a large area on the entire surface, a plurality of reflection portions having small areas are preferably divisionally arranged. However, when the plurality of reflection portions having small areas are provided, gaps are generated between the reflection portions.

The condensing position of light (oblique incident light) that has obliquely entered the solid-state imaging apparatus shifts from the condensing position of vertical incident light. For this reason, when reflection portions having small areas are formed, the oblique incident light partially leaks to the gaps between the reflection portions. Since some light components are not reflected by the reflection portions, the light sensitivity may lower.

SUMMARY OF THE INVENTION

The present invention provides a solid-state imaging apparatus having a high light sensitivity.

One of the aspects of the present invention provides a solid-state imaging apparatus, comprising a semiconductor layer including a first surface and a second surface which oppose each other, a first region provided on a side of the first surface of the semiconductor layer, and a second region provided on a side of the second surface of the semiconductor layer, wherein a plurality of photoelectric conversion portions are arrayed in the semiconductor layer, a plurality of lens portions each configured to focus light are arrayed in the first region along the first surface, and an interconnection pattern and a plurality of reflection portions each configured to reflect the light are arrayed in the second region along the first surface, the solid-state imaging apparatus includes a pixel in which a light beam that has entered the photoelectric conversion portion from the side of the first surface via the lens portion passes through the second surface, is reflected by a reflection surface of the reflection portion, and enters the photoelectric conversion portion from the side of the second surface, and, in the pixel, the solid-state imaging apparatus has a structure in which sectional areas, on the second surface and on the reflection surface, of the light beam traveling from the photoelectric conversion portion to the reflection portion, are larger than a sectional area, in a portion between the photoelectric conversion portion and the reflection portion, of the light beam traveling from the photoelectric conversion portion to the reflection portion.

Further features of the present invention will become apparent from the following description of exemplary embodiments with reference to the attached drawings.

BRIEF DESCRIPTION OF THE DRAWINGS

FIGS. 2A to 2C are views for explaining the arrangement example according to the embodiment;

DESCRIPTION OF THE EMBODIMENTS

Figure 1A:
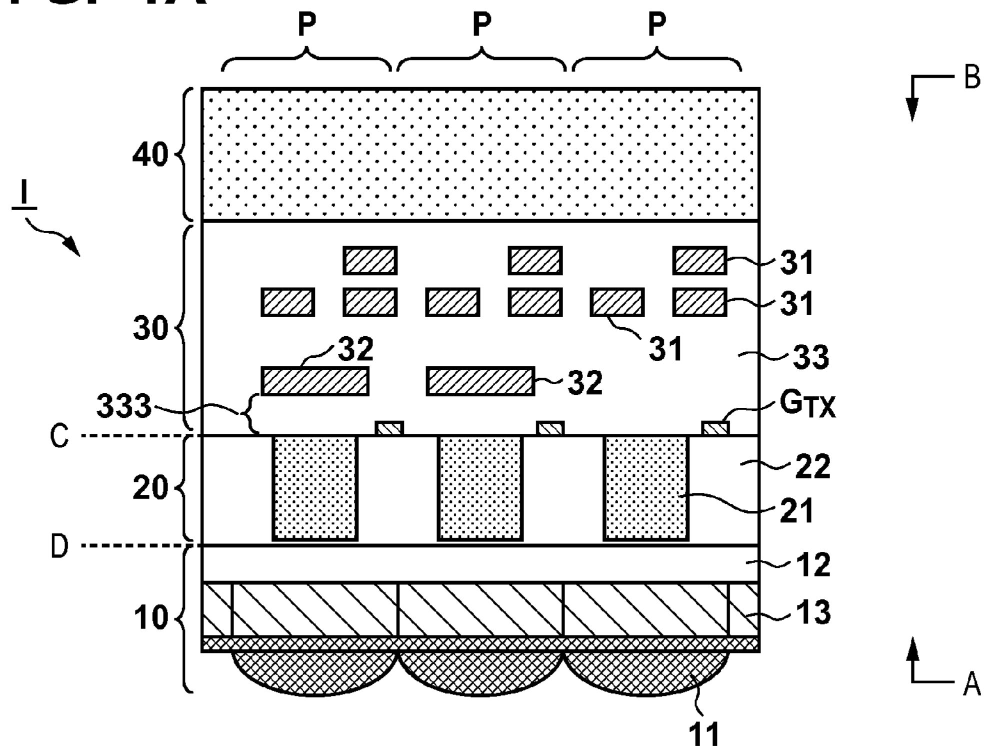
FIGS. 1A and 1B are views for explaining an arrangement example according to an embodiment.

A solid-state imaging apparatus I according to this embodiment will be described with reference to FIGS. 1A to 2C. As shown in FIG. 1A, the solid-state imaging apparatus I has a back-side illumination structure, and includes a front surface A that is the surface on the light incident side, and a back surface B that is the surface on the opposite side. The solid-state imaging apparatus I includes an optical region 10, a semiconductor region 20, and an interconnection region 30 from the front surface A to the back surface B. The semiconductor region 20 includes a semiconductor layer 22 having an obverse surface C (second surface) and a reverse surface D (first surface). The solid-state imaging apparatus I is formed by arraying, along the extending direction of the front surface A that is the light incident surface, pixels P each including part of the optical region 10, part of the semiconductor region 20, and part of the interconnection region 30. A supporting substrate 40 is arranged on the side of the back surface B.

The optical region 10 includes a microlens array 11 (first region) that forms the front surface A. The microlens array 11 is formed by arranging, along the reverse surface D, a plurality of lens portions each of which condenses light. The optical region 10 can include an intermediate film 12 (light transmission portion or light passing portion) made of a material (for example, silicon oxide or silicon nitride) that transmits light. The optical region 10 also includes a color filter array 13 arranged between the microlens array 11 and the intermediate film 12.

The intermediate film 12 can have a function of adjusting the distance between the semiconductor region 20 and the microlens array 11. The intermediate film 12 can also have the functions of a protective film (passivation film), an antireflection film, and a planarizing film. The intermediate film 12 can be either a single-layer film or a multilayer film.

A plurality of photoelectric conversion portions 21 are arranged in the semiconductor layer 22 of the semiconductor region 20 along the obverse surface C and the reverse surface D. The typical photoelectric conversion portion 21 is a photodiode including a p-type impurity region and an n-type impurity region. Light that has entered from the front surface A and passed through the optical region 10 enters the semiconductor layer 22 from the reverse surface D and is photoelectrically converted by the photoelectric conversion portions 21 so that an electrical signal corresponding to the incident light amount is obtained.

The semiconductor region 20 includes semiconductor elements such as transistors in addition to the photoelectric conversion portions 21. The semiconductor region 20 can also include gate electrodes provided on the obverse surface C of the semiconductor layer 22 to form MOS transistors. The semiconductor region 20 can also include an element isolation that electrically isolates the photoelectric conversion portions 21 and the semiconductor elements for each other.

The interconnection region 30 includes interconnection patterns 31 that are formed inside an interlayer dielectric film 33 of, for example, $SiO_2$ and made of a metal material such as aluminum or copper. The interconnection patterns 31 are used to, for example, supply power or drive various kinds of transistors and read a signal.

Figure 1B:
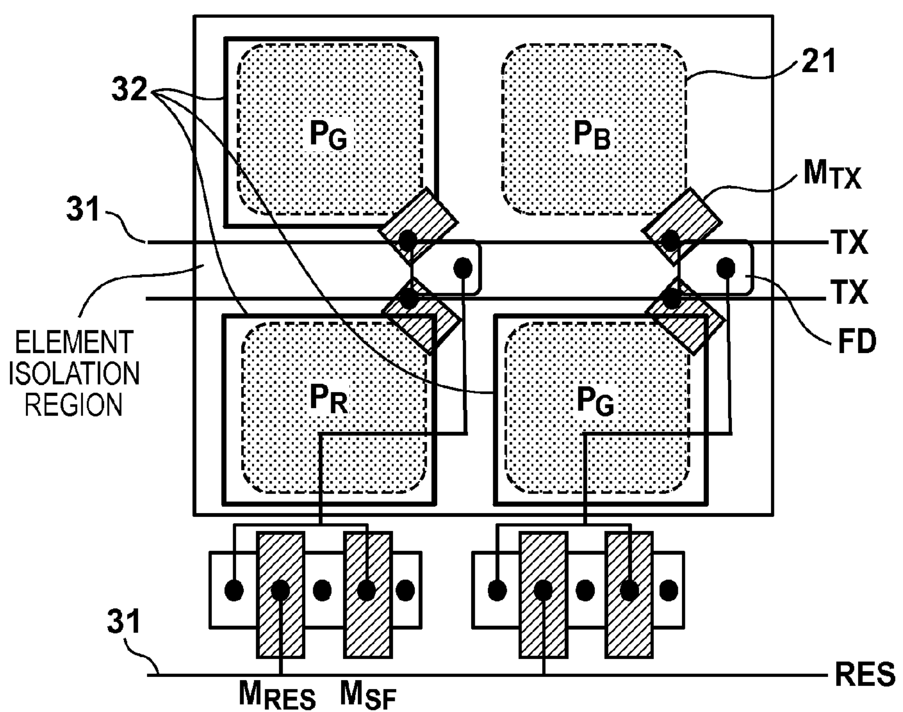

FIG. 1B is a plan view schematically showing the layout of the solid-state imaging apparatus I. The plurality of pixels P can include a plurality of types. For example, the light selection portion of the color filter array 13 changes between the types of the pixels P. A pixel corresponding to a blue-light selection portion (blue filter) that selectively transmits blue light (wavelength $\lambda_B$=about 430 to 480 [nm]) will be defined as a blue pixel $P_B$. A pixel corresponding to a green-light selection portion (green filter) that selectively transmits green light (wavelength $\lambda_G$=about 500 to 570 [nm]) will be defined as a green pixel $P_G$. A pixel corresponding to a red-light selection portion (red filter) that selectively transmits red light (wavelength $\lambda_R$=about 610 to 780 [nm]) will be defined as a red pixel $P_R$. The blue filters, green filters, and red filters can be arrayed in accordance with a Bayer arrangement. Note that FIGS. 1A and 1B illustrate three types of or four pixels P for the descriptive convenience.

In each pixel P, transistors (pixel transistors) configured to read the electrical signal are arranged in correspondence with the photoelectric conversion portion 21. The pixel transistors include, for example, a transfer transistor $M_{TX}$, a reset transistor $M_{RES}$, and a source follower transistor $M_{SF}$. A signal line for transmitting a control signal TX can be connected to the gate terminal of the transfer transistor $M_{TX}$. When the control signal TX is activated, the transfer transistor $M_{TX}$ transfers, to a floating diffusion FD, charges generated by the photoelectric conversion portion 21 and accumulated upon receiving light. The amount of the current flowing to the source follower transistor $M_{SF}$ can change in accordance with the potential variation caused by the charges transferred to the floating diffusion FD. In this way, a pixel signal can be read from each pixel P. A signal line for transmitting a control signal RES can be connected to the gate terminal of the reset transistor $M_{RES}$. When the control signal RES is activated, the reset transistor $M_{RES}$ can reset the potential of the floating diffusion FD. A select transistor (not shown) may be arranged in each pixel P to selectively output the pixel signal. Note that FIG. 1A illustrates a gate electrode $G_{TX}$ of the transfer transistor $M_{TX}$.

The back-side illumination solid-state imaging apparatus generally includes the semiconductor layer 22 thinner than in a front-side illumination solid-state imaging apparatus. The thickness is 1 to 10 [nm] or about 2 to 5 [μm]. Hence, as for, for example, light having a long wavelength such as red light, some components of the light that has entered the semiconductor layer 22 from the reverse surface D can transmit without being photoelectrically converted. In a single silicon crystal, the depth to absorb ½ of red light having a wavelength of 700 [nm] is 3 [μm]. That is, ½ out of red light that has entered a 3-[μm] thick silicon layer transmits through the silicon layer. To prevent this, for, for example, the red pixel $P_R$, a reflection portion 32 is arranged in the interconnection region 30, like the pixels P shown on the left side and at the center of FIG. 1A (second region).

The reflection portion 32 may be formed in the interconnection layer of the first layer (the interconnection layer closest to the semiconductor layer 22), in the interconnection layer of the second or subsequent layer, or in a layer different from the interconnection layer for forming the interconnection patterns 31. To improve the reflectivity, a reflection surface R of the reflection portion 32 is preferably made of aluminum. As the material of the interconnection layer, copper having a conductivity higher than that of aluminum can be used. As the material of the reflection portion 32, aluminum having a high reflectivity than copper can be used. The green pixel $P_G$ is preferably provided with the reflection portion 32 because the sensitivity to green light largely affects image quality obtained by the solid-state imaging apparatus as compared to the sensitivity to red light or blue light.

The blue pixel $P_B$ may be provided with the reflection portion 32. However, the reflection portion 32 may be omitted, and for example, an interconnection pattern may be arranged instead. This is because light having a short wavelength such as blue light is absorbed by the semiconductor layer 22 before some components of the light that has entered the semiconductor layer 22 from the reverse surface D reach the obverse surface C, and hardly transmits through the semiconductor layer 22. In a single silicon crystal, the depth to absorb ½ of blue light having a wavelength of 460 [nm] is about 0.3 [μm]. For the blue pixel $P_B$ that does not need the reflection portion 32, a metal pattern capable of functioning as a reflection portion may be provided at the same distance as the reflection portion 32 from the semiconductor layer 22. However, stray light from a pixel of another color may be reflected by the metal pattern of the blue pixel $P_B$ and cause a mixture of colors. To prevent this, preferably, the blue pixel $P_B$ is prohibited from having the metal pattern at the same distance as the reflection portion 32 from the semiconductor layer 22, and the area of the metal pattern is made smaller than the reflection portions 32 of the pixels of other colors, and the reflection portion 32 is omitted.

In the red pixel $P_R$ (and the green pixel $P_G$) provided with the reflection portion 32, a light beam which is a bundle of light rays formed via the lens portion of the microlens array 11 enters the photoelectric conversion portion 21 from the reverse surface D of the semiconductor layer 22. As described above, this light beam can transmit through the semiconductor layer 22. In this embodiment, the reflection surface R of the reflection portion 32 is spaced apart from the semiconductor layer 22. The light beam that has exited from the obverse surface C of the semiconductor layer 22 transmits through an intermediate portion 333 of the interlayer dielectric film 33, which is a portion between the reflection portion 32 and the semiconductor layer 22 (a portion between the obverse surface C and the reflection surface R), and travels from the photoelectric conversion portion 21 to the reflection portion 32. The light beam is reflected by the reflection surface R of the reflection portion 32 and travels from the reflection portion 32 to the photoelectric conversion portion 21. The light beam enters the photoelectric conversion portion 21 from the surface of the semiconductor layer 22. There can exist such a light beam that passes through the reverse surface D and then passes through the obverse surface C, is reflected by the reflection surface R, and then passes through the obverse surface C again. This light beam will be described in more detail with reference to FIGS. 2A to 2C.

FIGS. 2A to 2C are enlarged views of the portion of the interlayer dielectric film 33 located between the reflection portion 32 and the semiconductor layer 22 in the red pixel $P_R$ (and the green pixel $P_G$). The alternate long and short dashed lines in FIGS. 2A to 2C indicate the outline of a light beam traveling from the photoelectric conversion portion 21 to the reflection portion 32 (to be referred to as a forward light beam hereinafter). The alternate long and two short dashed lines in FIGS. 2A to 2C indicate the outline of a light beam traveling from the reflection portion 32 to the photoelectric conversion portion 21 (to be referred to as a backward light beam hereinafter). The forward light beam and the backward light beam are light beams having pointing vectors facing opposite directions. FIGS. 2A to 2C illustrate a portion corresponding to the width of the light beam as a sectional area for convenience' sake. Let S1 be the sectional area of the forward light beam on the obverse surface C of the semiconductor layer 22, S2 be the sectional area of the forward light beam in the intermediate portion 333, S3 be the sectional area of the forward light beam (and the backward light beam) on the reflection surface R, S4 be the sectional area of the backward light beam in the intermediate portion 333, and S5 be the sectional area of the backward light beam on the obverse surface C of the semiconductor layer 22.

FIG. 2A illustrates a case in which in the red pixel $P_R$ (and the green pixel $P_G$) including the reflection portion 32, the sectional area S1 of the forward light beam on the obverse surface C and the sectional area S3 of the forward light beam on the reflection surface R are larger than the sectional area S2 of the forward light beam in the intermediate portion 333. That is, $S2<S1$, and $S2<S3$ can be met. In addition, $S3<S4<S5$ holds. Furthermore, $S1<S5$, and $S2\leq S4$ can hold. $S1>S3$ is more preferable than $S1\leq S3$. This makes it possible to reduce the sectional area S5 and suppress a mixture of colors caused by the backward light beam that enters the photoelectric conversion portion 21 different from that the forward light beam has entered.

$S2<S1$, and $S2<S3$ need not always be met throughout the portion between the obverse surface C and the reflection surface R. $S2<S1$, and $S2<S3$ need only be met in part of the portion between the obverse surface C and the reflection surface R. For example, when $S3<S1$, $S3\leq S2<S1$ holds in a portion of the intermediate portion 333 close to the semiconductor layer 22, and $S2<S3<S1$ holds in the remaining portions. The sectional area S2 can take the minimum value at a position indicated by a point X. The point X is the condensing point X to be described later. The section of the light beam at the condensing point X can be regarded as a circle of least confusion. Meeting $S2<S1$, and $S2<S3$ means that the condensing point X is formed in the intermediate portion 333 by the forward light beam. At the condensing point X, the strength of the pointing vector can take the maximum value. Note that the pointing vector does not necessarily take the maximum value at the condensing point X because light absorption occurs in the semiconductor layer 22.

FIGS. 2B and 2C illustrate cases in which the sectional area S3 of the forward light beam on the reflection surface R is smaller than the sectional area S2 of the forward light beam in the intermediate portion 333 and larger than the sectional area S4 of the backward light beam in the intermediate portion 333 ($S2>S3>S4$). In addition, the sectional area S5 of the backward light beam on the obverse surface C is smaller than the sectional area S1 of the forward light beam on the obverse surface C ($S1>S5$). In the above-described example, FIG. 2B shows a case in which $S4<S3$, and $S4<S5$. FIG. 2C shows a case in which $S3>S4>S5$. The sectional area S5 of the backward light beam on the obverse surface C is preferably smaller than the sectional area S3 of the backward light beam on the reflection surface R ($S3>S5$). This makes it possible to suppress a mixture of colors caused by the backward light beam that enters the photoelectric conversion portion 21 different from that the forward light beam has entered.

In the solid-state imaging apparatus I, interconnections for power supply, pixel driving, or signal read are provided on the side of the obverse surface C (second surface side) of the semiconductor layer 22. It is therefore difficult to provide a reflection portion having almost the same size as the total area of the obverse surface C. When a plurality of reflection portions are divisionally provided, interconnection patterns and plugs, which form the above-described interconnections, can be arranged among the reflection portions. A plurality of reflection portions each having a relatively large reflection surface may be provided for a plurality of types of pixels. When the plurality of reflection portions 32 each having a reflection surface larger than the photoelectric conversion portion 21 are provided for a plurality of pixels, the incident light utilization efficiency can be improved, and the light sensitivity of the solid-state imaging apparatus I can be improved. However, the interconnection layout is subject to constraints, and mixtures of colors caused by stray light can also increase. Hence, an area S0 of the reflection portion 32 is preferably made as small as possible. The area S0 of the reflection surface R is preferably larger than the sectional area S1 of the forward light beam on the obverse surface C ($S0>S1$).

Figure 3A:
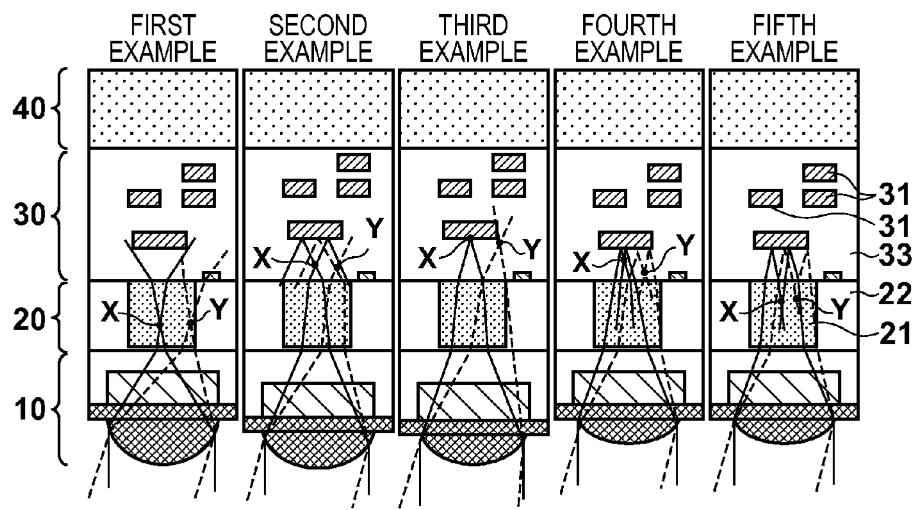
FIGS. 3A to 3C are views for explaining a result of comparison with another arrangement example.

FIG. 3A shows five examples in which the condensing points X are located at different positions. The first example illustrates a relation $S1<S2<S3$. That is, the first example schematically shows a case in which the condensing point X is formed in the photoelectric conversion portion 21. The second example illustrates relations $S2<S1$, and $S2<S3$. The second example schematically shows a case in which the condensing point X is formed between the photoelectric conversion portion 21 and the reflection portion 32. That is, the second example indicates a case in which $S2<S1$, and $S2<S3$ hold in at least part of the intermediate portion 333. The third example schematically shows, out of cases in which a relation $S1>S2>S3$ holds, a case in which the condensing point X is formed on the surface of the reflection portion 32.

The fourth example schematically shows, out of cases in which a relation $S1>S2>S3$ holds, a case in which $S2>S3>S4$ holds, and $S4<S3$, and $S4<S5$ also hold (that is, a case in which the condensing point X is formed between the photoelectric conversion portion 21 and the reflection portion 32). In this case, $S4<S3$, and $S4<S5$ hold in at least part of the intermediate portion 333. The fifth example schematically shows, out of cases in which a relation $S1>S2>S3$ holds, a case in which $S2>S3>S4$ holds, and $S3>S4>S5$ also holds (that is, a case in which the condensing point X is formed in the photoelectric conversion portion 21).

The condensing point X represents a point where the sectional area of the light beam of vertical incident light is minimized after the light has passed through the optical region 10 and before or when the light is reflected by the reflection portion 32. Similarly, a condensing point Y represents a point where the sectional area of the light beam of oblique incident light is minimized after the light has passed through the optical region 10 and before or when the light is reflected by the reflection portion 32. The condensing point X or Y indicates a point where the sectional area of the light beam of the vertical incident light or oblique incident light is minimized by the whole optical system of the solid-state imaging apparatus I. The above-described magnitude relationships between the sectional areas of the light beam can hold not only in vertical incident light but also in oblique incident light.

The position of the condensing point X or Y is determined not only by the focal length of one lens portion of the microlens array 11. That is, the vertical incident light or oblique incident light is refracted by the interfaces of members included in the optical system. A point where the sectional area of the light beam is minimized before or when the light is reflected by the reflection portion 32 is determined as the condensing point X or Y. Refraction by the obverse surface C or reverse surface D can largely affects the position of the condensing point X or Y. This is because the refractive index difference between silicon used in the semiconductor layer and silicon oxide or silicon nitride used in the insulating layer is larger than the refractive index difference between silicon oxide and silicon nitride. Note that the obverse surface C can be the interface between the optical region 10 and the semiconductor region 20. The reverse surface D can be the interface between the semiconductor region 20 and the interconnection region 30.

Figure 3B:
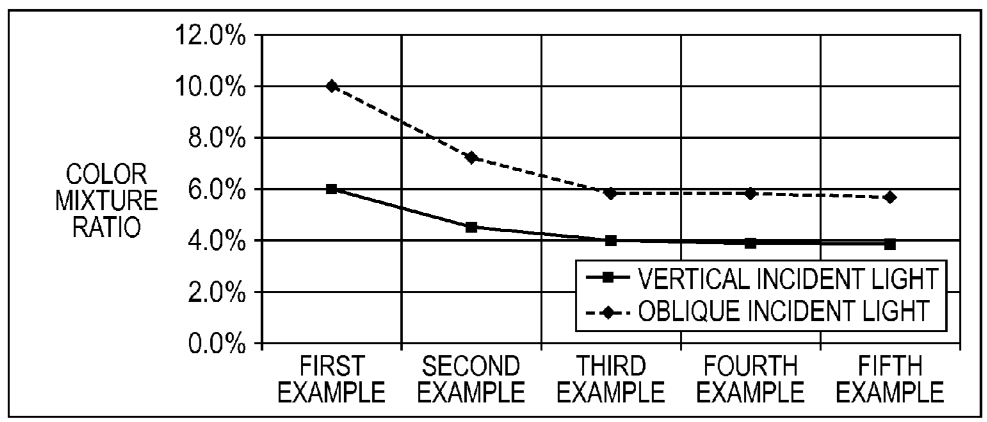
Figure 3C:
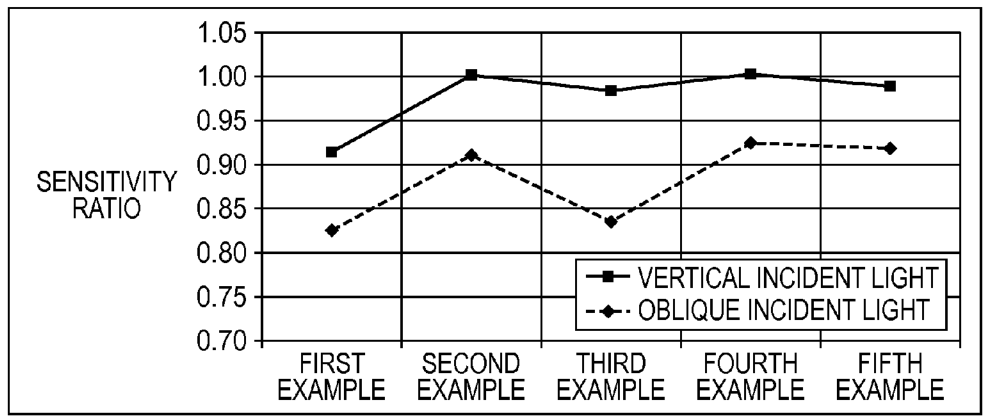

FIG. 3B shows, for each of vertical incident light and oblique incident light, the calculation result of the ratio of a mixture of colors which occurs between adjacent pixels in the solid-state imaging apparatus I. Light that has entered the front surface A serving as the incident surface from a direction perpendicular to the obverse surface C (incident angle) 0° will be exemplified as the vertical incident light. Light that has entered the front surface A serving as the incident surface from a direction oblique to the obverse surface C (incident angle 15°) will be exemplified as the oblique incident light. Similarly, FIG. 3C shows, for each of vertical incident light and oblique incident light, the calculation result of the light sensitivity of the solid-state imaging apparatus I. The calculation results exemplify green light having the wavelength $\lambda$=550 [nm].

As described above, the area S0 of the reflection portion 32 is preferably as small as possible. However, if the condensing points X and Y are located in the semiconductor layer 22, as in the first example, the sectional area of the light beam near the reflection surface R is larger than the area S0 of the reflection surface R, and some light components may be unreflected by the reflection portion 32. In addition, since the condensing point Y of the oblique incident light shifts from the condensing point X of the vertical incident light, the ratio of light that cannot strike the reflection surface R increases. As a result, according to the first example, many light components of the oblique incident light are not reflected by the reflection portion 32, resulting in a lower light sensitivity.

In the third example, the oblique incident light may be unreflected by the reflection portion 32, resulting in a lower light sensitivity. This is because the sectional area S3 of the light beam on the reflection surface R is very small, and the light that has failed even slightly in striking the reflection surface R is mostly unreflected.

On the other hand, according to the second example, the sensitivity to the oblique incident light is higher than in the third example. According to the second example, to say nothing of the vertical incident light, many light components out of the oblique incident light that has entered the reflection portion 32 are reflected toward the photoelectric conversion portion 21. This can suppress a decrease in the light sensitivity to the oblique incident light.

In the fourth and fifth examples, the vertical incident light is reflected by the reflection portion 32 toward the inside of the pixel P (or the inside of the photoelectric conversion portion 21). This suppresses a mixture of colors with respect to an adjacent pixel. Especially, in the fourth example, a result was obtained in which the photoelectric conversion efficiency of incident light and reflected light in the photoelectric conversion portion 21 was highest, and the light sensitivity of the solid-state imaging apparatus I was improved. In the above-described structure, even oblique incident light is effectively reflected by the reflection portion 32 toward the photoelectric conversion portion 21, and a decrease in the light sensitivity can be suppressed.

As shown in FIG. 3A, in the first to third examples, the vertical incident light is reflected by the reflection portion 32 toward the outside of the pixel P. In the fourth and fifth examples, however, the vertical incident light is reflected toward the inside of the pixel P. As a result, according to the fourth and fifth examples, it is possible to suppress stray light entering an adjacent pixel and reduce a mixture of colors between adjacent pixels, as shown in FIG. 3B.

Hence, according to the second, fourth, and fifth examples, in the back-side illumination solid-state imaging apparatus I, the light sensitivity can be improved for both vertical incident light and oblique incident light. According to the fourth and fifth examples, a mixture of colors between adjacent pixels can be reduced. Hence, in the solid-state imaging apparatus I, it is possible to implement excellent f-number proportionality in the imaging system. It is also possible to implement to reduce the sensitivity difference between the center and the peripheral portion of the imaging region of the solid-state imaging apparatus I and implement satisfactory intra-frame uniformity.

As described above, as the first form, the solid-state imaging apparatus I is designed to meet a condition that the sectional area of the light beam of vertical incident light is minimized after the light has passed through the optical region 10 and before it is reflected by the reflection portion 32. In this case, the solid-state imaging apparatus I is designed to minimize the sectional area of light that has passed through the semiconductor region 20 and is to be reflected by the reflection portion 32 to the side of the photoelectric conversion portion 21, that is, the forward light beam. For example, the above-described design is done for green light in the green pixel $P_G$, and for red light in the red pixel $P_R$.

As the second form, the solid-state imaging apparatus I is designed to meet a condition that the sectional area of the light beam of vertical incident light is minimized after the light has passed through the optical region 10 and been reflected by the reflection portion 32. For example, the above-described design is done for green light in the green pixel $P_G$, and for red light in the red pixel $P_R$.

The behavior of light in the solid-state imaging apparatus I can be examined using a 3D wave optical simulator using FDTD (Finite Difference Time Domain method). The forward light beam and the backward light beam can be discriminated by the direction of the pointing vector. The condensing points X and Y can be discriminated by the strength of the pointing vector.

The solid-state imaging apparatus I can be manufactured using a known semiconductor manufacturing process. More specifically, for example, an n-type impurity is implanted into a p-type semiconductor substrate from the side of an obverse surface C, thereby forming photoelectric conversion portions 21. Next, for example, an interconnection region 30 including an interlayer dielectric film 33 and interconnection layers and reflection portions 32 provided in it is formed on the obverse surface C. The semiconductor substrate is polished from a side opposite to the obverse surface C on which the photoelectric conversion portions 21 are formed, thereby obtaining a semiconductor layer 22 having an appropriate thickness.

After that, an optical region 10 is provided on a reverse surface D (first surface side) that is the surface of the semiconductor layer 22 on the polished side. The positions and sizes of the reflection portions 32 can be designed to meet the above-described conditions of condensing points X and Y in consideration of the structure of the optical region 10, the thickness of the semiconductor layer 22, the refractive indices of the members of these components, and the like. For example, an intermediate film 12 may be formed from a plurality of layers having optical transparency or designed for each type of pixel P to meet the above-described conditions for the wavelength of light corresponding to the type of pixel P.

Figure 4A:
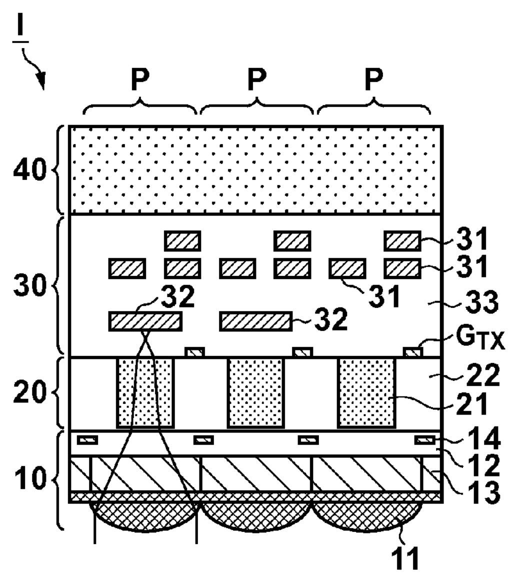
FIGS. 4A to 4D are views for explaining an arrangement example according to another embodiment.

The embodiment has been described above. However, the present invention is not limited to this. The present invention can appropriately be modified in accordance with the object, state, application purpose, function, and other specifications and can also be implemented by another embodiment. For example, as shown in FIG. 4A, the optical region 10 may include a light-shielding portion 14 for shielding light at each boundary between the adjacent pixels P. According to this arrangement, it is possible to prevent light that has entered the microlens 11 of each pixel P from entering an adjacent pixel without entering the corresponding photoelectric conversion portion 21 and thus prevent a mixture of colors with respect to the adjacent pixels.

Figure 4B:
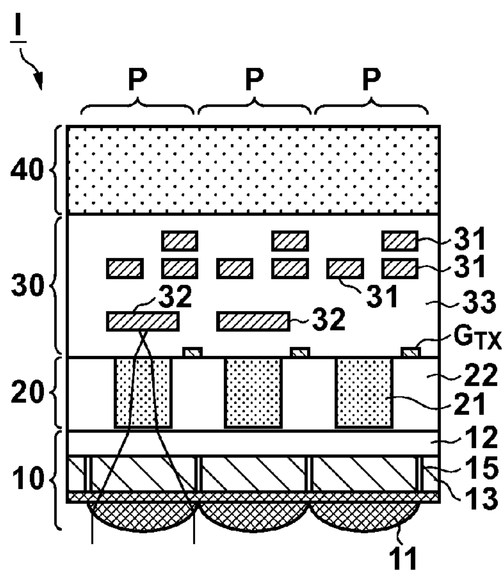

As illustrated in FIG. 4B, the optical region 10 may include a portion (low refractive index portion 15) having a refractive index lower than that of the light passing portion at each boundary between the adjacent pixels P. In the example shown in FIG. 4B, the light passing portion is the wavelength selection portion of the color filter array 13. However, it may be the light passing portion of the microlens array 11 or the intermediate film 12. The low refractive index portion 15 can be made of, for example, a gas, a resin, or silicon oxide. As shown in FIG. 4B, the low refractive index portion 15 is arranged between the light passing portions (between the light transmission portions) of the color filter array 13. The present invention is not limited to this structure. For example, a plurality of silicon nitride portions may be arrayed in the intermediate film 12 as the light passing portions, and silicon oxide portions serving as the low refractive index portions may be arranged between the silicon nitride portions. According to the arrangement including the low refractive index portions, out of light that has entered the microlens 11 of the pixel P, light components traveling toward the low refractive index portion 15 are readily totally reflected by the low refractive index portion 15 toward the photoelectric conversion portion 21 of the pixel P. It is therefore possible to prevent a mixture of colors with respect to the adjacent pixels.

Figure 4C:
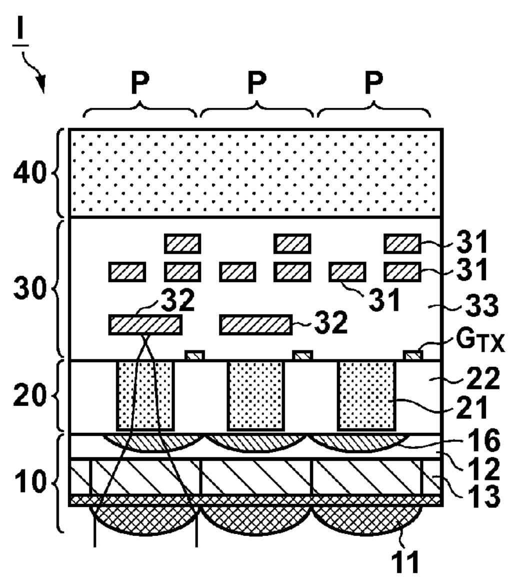

As illustrated in FIG. 4C, the intermediate film 12 may be formed from at least two members (or layers) whose refractive indices are different from each other. In addition, an intra-layer lens array 16 may be formed in the intermediate film 12 by forming a curved surface (or a predetermined curvature) at the boundary between the at least two members (or layers). The intra-layer lens array 16 is provided between the microlens array 11 and the semiconductor region 20 in which the photoelectric conversion portions 21 are arrayed. In addition, the intra-layer lens array 16 is provided between the color filter array 13 and the semiconductor region 20 in which the photoelectric conversion portions 21 are arrayed. In one pixel, the microlens array 11 can form a first lens portion, and the intra-layer lens array 16 can form a second lens portion.

Figure 4D:
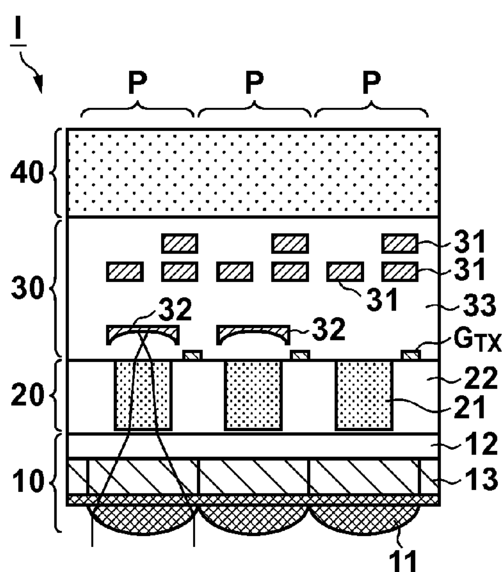

As illustrated in FIG. 4D, the reflection surface of the reflection portion 32 can have a concave shape to reflect light toward the center of the photoelectric conversion portion 21. The reflection surface can have, for example, either a curved shape having a predetermined curvature or a triangular shape. According to this arrangement, light that has transmitted through the photoelectric conversion portion 21 is effectively reflected by the reflection portion 32 toward the photoelectric conversion portion 21. Hence, the light sensitivity can be improved as compared to a case in which the reflection surface is flat.

An imaging system can be constructed using the above-described solid-state imaging apparatus. The imaging system includes not only a camera mainly aiming at image capturing but also an electronic apparatus (for example, a personal computer or a portable terminal) secondarily having an image capturing function. The imaging system can include the solid-state imaging apparatus exemplified in the above embodiment, and a processing unit that processes a signal output from the solid-state imaging apparatus. The processing unit can include, for example, a processor that processes digital data based on signal charges generated in the photoelectric conversion portion 21. An A/D converter that generates the digital data can be mounted on the solid-state imaging apparatus as an on-chip device or another chip. An integrated circuit of a processor or the like may be formed on the supporting substrate 40 to constitute an SIP (System In Package). The imaging system can include a display unit that displays an image obtained from the solid-state imaging apparatus or a storage unit that stores image data.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2012-237267, filed Oct. 26, 2012, and 2012-237268, filed Oct. 26, 2012, which are hereby incorporated by reference herein in their entirety.

What is claimed is:

1. A solid-state imaging apparatus comprising:

a semiconductor layer including a first surface and a second surface which oppose each other;

a first region provided on a side of the first surface of the semiconductor layer; and a second region provided on a side of the second surface of the semiconductor layer, wherein a plurality of photoelectric conversion portions are arrayed in the semiconductor layer, a plurality of lens portions each configured to focus light are arrayed in the first region along the first surface, and an interconnection pattern and a plurality of reflection portions each configured to reflect the light are arrayed in the second region along the first surface, the solid-state imaging apparatus includes a pixel in which a light beam that has entered the photoelectric conversion portion from the side of the first surface via the lens portion passes through the second surface, is reflected by a reflection surface of the reflection portion, and enters the photoelectric conversion portion from the side of the second surface, and in the pixel, the solid-state imaging apparatus has a structure in which sectional areas, on the second surface and on the reflection surface, of the light beam traveling from the photoelectric conversion portion to the reflection portion, are larger than a sectional area, in a portion between the photoelectric conversion portion and the reflection portion, of the light beam traveling from the photoelectric conversion portion to the reflection portion.

2. The apparatus according to claim 1, wherein the sectional area, on the reflection surface, of the light beam traveling from the photoelectric conversion portion to the reflection portion is smaller than the sectional area, on the second surface, of the light beam traveling from the photoelectric conversion portion to the reflection portion.

3. The apparatus according to claim 1, wherein an area of the reflection surface is larger than the sectional area, on the second surface, of the light beam traveling from the photoelectric conversion portion to the reflection portion, and smaller than the sectional area, on the second surface, of the light beam traveling from the reflection portion to the photoelectric conversion portion.

4. The apparatus according to claim 1, wherein the first region is provided with a red-light selection portion configured to selectively transmit red light, a green-light selection portion configured to selectively transmit green light, and a blue-light selection portion configured to selectively transmit blue light, and the light beam passes through one of the green-light selection portion and the red-light selection portion.

5. The apparatus according to claim 4, wherein in the pixel including the photoelectric conversion portion which receives the light beam that has passed through the blue-light selection portion, an area of a metal pattern at the same distance as the reflection portion from the semiconductor layer is smaller than an area of the reflection surface, or no metal pattern exists at the same distance as the reflection portion from the semiconductor layer.

6. The apparatus according to claim 1, wherein the first region includes a light-shielding portion configured to shield the light.

7. The apparatus according to claim 1, wherein the first region includes a plurality of light transmission portions and a low refractive index portion having a refractive index lower than that of the light transmission portions and arranged between the light transmission portions.

8. The apparatus according to claim 1, wherein the first region further includes a wavelength selection portion, and a lens portion provided between the wavelength selection portion and the photoelectric conversion portion.

9. The apparatus according to claim 1, wherein the reflection surface comprises a concave surface.

10. An imaging system comprising:

a solid-state imaging apparatus of claim 1; and a processing unit configured to process a signal output from the solid-state imaging apparatus.

11. A solid-state imaging apparatus comprising:

a semiconductor layer including a first surface and a second surface which oppose each other;

a first region provided on a side of the first surface of the semiconductor layer; and a second region provided on a side of the second surface of the semiconductor layer, wherein a plurality of photoelectric conversion portions are arrayed in the semiconductor layer, a plurality of lens portions each configured to focus light are arrayed in the first region along the first surface, and an interconnection pattern and a plurality of reflection portions each configured to reflect the light are arrayed in the second region along the first surface, the solid-state imaging apparatus includes a pixel in which a light beam that has entered the photoelectric conversion portion from the side of the first surface via the lens portion passes through the second surface, is reflected by a reflection surface of the reflection portion, and enters the photoelectric conversion portion from the side of the second surface, and in the pixel, the solid-state imaging apparatus has a structure in which a sectional area, on the reflection surface, of the light beam is smaller than a sectional area, in a portion between the photoelectric conversion portion and the reflection portion, of the light beam traveling from the photoelectric conversion portion to the reflection portion, and larger than the sectional area, in the portion between the photoelectric conversion portion and the reflection portion, of the light beam traveling from the reflection portion to the photoelectric conversion portion.

12. The apparatus according to claim 11, wherein the sectional area, on the second surface, of the light beam traveling from the reflection portion to the photoelectric conversion portion is smaller than the sectional area, on the second surface, of the light beam traveling from the photoelectric conversion portion to the reflection portion.

13. The apparatus according to claim 11, wherein the sectional area, on the second surface, of the light beam traveling from the reflection portion to the photoelectric conversion portion is smaller than the sectional area, on the reflection surface, of the light beam.

14. The apparatus according to claim 11, wherein the first region is provided with a red-light selection portion configured to selectively transmit red light, a green-light selection portion configured to selectively transmit green light, and a blue-light selection portion configured to selectively transmit blue light, and the light beam passes through one of the green-light selection portion and the red-light selection portion.

15. The apparatus according to claim 14, wherein in the pixel including the photoelectric conversion portion which receives the light beam that has passed through the blue-light selection portion, an area of a metal pattern at the same distance as the reflection portion from the semiconductor layer is smaller than an area of the reflection surface, or no metal pattern exists at the same distance as the reflection portion from the semiconductor layer.

16. The apparatus according to claim 11, wherein the first region includes a light-shielding portion configured to shield the light.

17. The apparatus according to claim 11, wherein the first region includes a plurality of light transmission portions and a low refractive index portion having a refractive index lower than that of the light transmission portions and arranged between the light transmission portions.

18. The apparatus according to claim 11, wherein the first region further includes a wavelength selection portion, and a lens portion provided between the wavelength selection portion and the photoelectric conversion portion.

19. The apparatus according to claim 11, wherein the reflection surface comprises a concave surface.

20. An imaging system comprising:

a solid-state imaging apparatus of claim 11; and a processing unit configured to process a signal output from the solid-state imaging apparatus.

* * * * *